US010554056B2

(12) United States Patent
Jeon et al.

(10) Patent No.: US 10,554,056 B2
(45) Date of Patent: Feb. 4, 2020

(54) FAULTY CELL DETECTION DEVICE AND FAULTY CELL DETECTION METHOD

(71) Applicant: Samsung Electronics Co., Ltd., Suwon-si (KR)

(72) Inventors: Jin Yong Jeon, Yongin-si (KR); Tae Won Song, Yongin-si (KR); Jin Ho Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 165 days.

(21) Appl. No.: 15/402,752

(22) Filed: Jan. 10, 2017

(65) Prior Publication Data

US 2017/0201103 A1    Jul. 13, 2017

(30) Foreign Application Priority Data

Jan. 12, 2016   (KR) ........................ 10-2016-0003853

(51) Int. Cl.
| | |
|---|---|
| *G01R 31/36* | (2019.01) |
| *H02J 7/00* | (2006.01) |
| *G01R 31/392* | (2019.01) |
| *G01R 31/396* | (2019.01) |
| *G01R 15/20* | (2006.01) |
| *H01M 10/48* | (2006.01) |

(Continued)

(52) U.S. Cl.
CPC .......... *H02J 7/0026* (2013.01); *G01R 15/202* (2013.01); *G01R 19/0092* (2013.01); *G01R 31/392* (2019.01); *G01R 31/396* (2019.01); *H01M 10/48* (2013.01); *H02J 7/0021* (2013.01); *G01R 31/382* (2019.01)

(58) Field of Classification Search
CPC .. H02J 7/0026; H02J 7/0021; G01R 31/3679; G01R 31/3606; G01R 31/3658
USPC ........................................................ 320/126
See application file for complete search history.

(56) References Cited

U.S. PATENT DOCUMENTS 4,274,043 A * 6/1981 Heitz ................ H01M 10/4207
307/151
5,015,958 A * 5/1991 Masia .................... G01M 3/045
174/11 R (Continued)

FOREIGN PATENT DOCUMENTS

JP         4667276 B2    4/2011
JP     2011-137682 A    7/2011

(Continued)

OTHER PUBLICATIONS

Derwent Report for WO 0245197 A2, published in 2002.*

*Primary Examiner* — Robert Grant
*Assistant Examiner* — John T Trischler
(74) *Attorney, Agent, or Firm* — NSIP Law

(57) ABSTRACT

A faulty cell detection device and a faulty cell detection method are provided for detecting a faulty cell of a battery pack using a current sensor. The device may include a current sensor including a first current sensor configured to measure a current of a battery pack including the battery module, and a second current sensor configured to measure a current of a battery cell among battery cells in the battery module. The device may also include a faulty cell detector configured to detect occurrence of the faulty cell based on the measured current of the battery pack and the measured current of the battery cell.

18 Claims, 11 Drawing Sheets

(51) Int. Cl.
*G01R 19/00* (2006.01)
*G01R 31/382* (2019.01)

(56) References Cited

U.S. PATENT DOCUMENTS

| | | | | |
|---|---|---|---|---|
| 5,557,189 A * | 9/1996 | Suzuki | H01M 10/44 | 320/119 |
| 6,104,967 A * | 8/2000 | Hagen | H02J 7/0021 | 429/50 |
| 6,208,039 B1 | 3/2001 | Mendelsohn et al. | | |
| 6,420,852 B1 * | 7/2002 | Sato | H01M 10/425 | 320/134 |
| 6,762,588 B2 * | 7/2004 | Miyazaki | B60L 11/185 | 320/116 |
| 6,891,352 B2 * | 5/2005 | Miyazaki | B60L 11/185 | 320/118 |
| 7,091,695 B2 * | 8/2006 | Miyazaki | B60L 11/185 | 320/116 |
| 7,123,136 B2 * | 10/2006 | Sugimoto | G01R 15/04 | 340/468 |
| 7,199,537 B2 * | 4/2007 | Okamura | B60L 15/2045 | 318/139 |
| 7,442,456 B2 | 10/2008 | Wheat et al. | | |
| 7,528,581 B2 * | 5/2009 | Miyazaki | B60L 11/185 | 320/116 |
| 7,696,727 B2 * | 4/2010 | Choi | G01R 15/002 | 320/128 |
| 7,777,451 B2 * | 8/2010 | Chang | B60L 11/1809 | 320/118 |
| 7,782,013 B2 * | 8/2010 | Chang | H01M 10/441 | 320/116 |
| 7,808,207 B1 * | 10/2010 | Chang | H01M 10/441 | 320/117 |
| 7,821,231 B1 * | 10/2010 | Chang | B60L 11/1809 | 320/126 |
| 7,825,632 B1 * | 11/2010 | Chang | H01M 10/441 | 320/135 |
| 7,888,945 B2 * | 2/2011 | Miyazaki | H02J 7/0026 | 320/116 |
| 8,098,047 B2 * | 1/2012 | Miyazaki | H02J 7/0026 | 320/116 |
| 8,106,661 B2 * | 1/2012 | Miyazaki | H02J 7/0026 | 320/116 |
| 8,120,321 B2 * | 2/2012 | Vezzini | H02J 7/0014 | 320/118 |
| 8,159,191 B2 * | 4/2012 | Chang | B60K 16/00 | 320/136 |
| 8,169,190 B2 * | 5/2012 | Miyazaki | H02J 7/0026 | 320/118 |
| 8,217,625 B2 * | 7/2012 | Chang | B60L 11/1809 | 320/118 |
| 8,228,036 B2 * | 7/2012 | Meyer | H02J 7/0026 | 320/134 |
| 8,242,746 B2 * | 8/2012 | Austerschulte | G01R 31/3658 | 320/120 |
| 8,253,382 B2 * | 8/2012 | Miyazaki | H02J 7/0026 | 320/132 |
| 8,283,892 B2 * | 10/2012 | Miyazaki | H02J 7/0026 | 320/116 |
| 8,288,992 B2 * | 10/2012 | Kramer | H02J 7/0016 | 320/117 |
| 8,396,680 B2 * | 3/2013 | Katrak | G01R 19/2509 | 324/522 |
| 8,427,099 B2 | 4/2013 | Wong | | |
| 8,486,548 B2 * | 7/2013 | Ueda | H01M 10/482 | 429/61 |
| 8,513,922 B2 * | 8/2013 | Yang | H02J 7/0026 | 320/116 |
| 8,564,247 B2 * | 10/2013 | Hintz | H02J 7/0016 | 320/117 |
| 8,581,551 B2 * | 11/2013 | Seo | G06F 1/26 | 320/101 |
| 8,598,846 B1 * | 12/2013 | Hartley | H02J 7/0016 | 320/118 |
| 8,847,553 B2 * | 9/2014 | Bohan, Jr. | H01M 10/4221 | 320/107 |
| 8,878,492 B2 * | 11/2014 | Furukawa | H01M 10/425 | 320/116 |
| 8,896,273 B2 * | 11/2014 | Miyazaki | H02J 7/0026 | 320/116 |
| 8,902,072 B2 | 12/2014 | Lee et al. | | |
| 9,005,788 B2 * | 4/2015 | Zhu | H01M 10/617 | 429/90 |
| 9,257,729 B2 * | 2/2016 | Hermann | B60L 58/14 | |
| 9,270,128 B2 * | 2/2016 | Tonomura | H02J 7/0029 | |
| 9,276,416 B2 * | 3/2016 | Kroenke | H02J 7/0021 | |
| 9,312,723 B2 * | 4/2016 | Nagata | H02J 7/0072 | |
| 9,341,678 B2 * | 5/2016 | Kim | H01M 10/425 | |
| 9,656,570 B2 * | 5/2017 | Tabatowski-Bush | B60L 58/15 | |
| 9,658,292 B2 * | 5/2017 | Roumi | G01R 31/3627 | |
| 9,678,163 B2 * | 6/2017 | McCoy | G01R 31/3606 | |
| 9,758,044 B2 * | 9/2017 | Gale | G01R 27/025 | |
| 9,766,294 B2 * | 9/2017 | Nakamura | H01M 2/105 | |
| 9,812,887 B2 * | 11/2017 | Nagata | H02J 7/0072 | |
| 9,840,161 B2 * | 12/2017 | Chikkannanavar | B60L 11/1861 | |
| 9,851,412 B2 * | 12/2017 | Haag | B60L 3/0046 | |
| 9,970,989 B2 * | 5/2018 | Nakamura | H01M 2/105 | |
| 10,042,006 B2 * | 8/2018 | Du | G01R 31/392 | |
| 10,124,789 B2 * | 11/2018 | Chang | B60L 3/0038 | |
| 10,156,589 B2 * | 12/2018 | Hebiguchi | G01R 15/08 | |
| 2002/0070707 A1 * | 6/2002 | Sato | H01M 10/425 | 320/134 |
| 2003/0044689 A1 * | 3/2003 | Miyazaki | B60L 11/185 | 429/320 |
| 2004/0178768 A1 * | 9/2004 | Miyazaki | B60L 11/185 | 320/116 |
| 2005/0073428 A1 * | 4/2005 | Sugimoto | G01R 15/04 | 340/815.45 |
| 2005/0110460 A1 * | 5/2005 | Arai | B60L 3/0046 | 320/116 |
| 2005/0164048 A1 * | 7/2005 | Wheat | H01M 8/04455 | 429/413 |
| 2005/0231169 A1 * | 10/2005 | Seo | G01K 7/24 | 320/150 |
| 2005/0242775 A1 * | 11/2005 | Miyazaki | B60L 11/185 | 320/116 |
| 2006/0267592 A1 * | 11/2006 | Choi | G01R 15/002 | 324/426 |
| 2007/0018613 A1 * | 1/2007 | Miyazaki | B60L 11/185 | 320/116 |
| 2008/0061740 A1 * | 3/2008 | Miyazaki | B60L 11/185 | 320/116 |
| 2008/0067978 A1 * | 3/2008 | Miyazaki | B60L 11/185 | 320/116 |
| 2008/0079395 A1 * | 4/2008 | Miyazaki | B60L 11/185 | 320/118 |
| 2008/0258683 A1 * | 10/2008 | Chang | H01M 10/441 | 320/112 |
| 2009/0027006 A1 * | 1/2009 | Vezzini | H02J 7/0014 | 320/118 |
| 2009/0066291 A1 * | 3/2009 | Tien | H02J 7/0016 | 320/118 |
| 2009/0072793 A1 * | 3/2009 | Chang | B60L 11/1809 | 320/134 |
| 2009/0169987 A1 * | 7/2009 | Miyazaki | B60L 11/185 | 429/158 |
| 2009/0179650 A1 * | 7/2009 | Omagari | G01R 31/3624 | 324/433 |
| 2009/0261781 A1 * | 10/2009 | Miyazaki | B60L 11/185 | 320/116 |
| 2009/0284223 A1 * | 11/2009 | Miyazaki | B60L 11/185 | 320/116 |
| 2009/0284224 A1 * | 11/2009 | Miyazaki | B60L 11/185 | 320/118 |
| 2009/0302802 A1 * | 12/2009 | Miyazaki | B60L 11/185 | 320/116 |

(56) References Cited

U.S. PATENT DOCUMENTS

| | | | |
|---|---|---|---|
| 2010/0100345 A1* | 4/2010 | Katrak | G01R 19/2509 702/65 |
| 2010/0136390 A1* | 6/2010 | Ueda | H01M 10/441 429/61 |
| 2010/0219837 A1* | 9/2010 | Austerschulte | G01R 31/362 324/429 |
| 2010/0244781 A1* | 9/2010 | Kramer | H02J 7/0016 320/162 |
| 2010/0253278 A1* | 10/2010 | Chang | B60K 16/00 320/101 |
| 2010/0253284 A1* | 10/2010 | Aoki | H01M 10/441 320/118 |
| 2010/0270972 A1* | 10/2010 | Chang | B60L 11/1809 320/118 |
| 2010/0277124 A1* | 11/2010 | Chang | H01M 10/441 320/118 |
| 2010/0283428 A1* | 11/2010 | Chang | B60L 11/1809 320/118 |
| 2011/0148361 A1 | 6/2011 | Yokotani | |
| 2011/0285538 A1* | 11/2011 | Lee | G01R 31/28 340/636.1 |
| 2011/0298417 A1* | 12/2011 | Stewart | G01R 31/025 320/107 |
| 2012/0038315 A1* | 2/2012 | Wong | H02J 7/0018 320/107 |
| 2012/0116699 A1* | 5/2012 | Haag | B60L 3/0046 702/63 |
| 2012/0182021 A1 | 7/2012 | McCoy et al. | |
| 2012/0286734 A1* | 11/2012 | Miyazaki | B60L 11/185 320/118 |
| 2013/0026993 A1* | 1/2013 | Hintz | H02J 7/0016 320/119 |
| 2013/0038296 A1* | 2/2013 | Roessel | B60K 6/28 320/136 |
| 2013/0113495 A1* | 5/2013 | Kim | H01M 10/425 324/434 |
| 2013/0140886 A1* | 6/2013 | Bito | B60L 3/0046 307/10.7 |
| 2013/0234721 A1* | 9/2013 | Nakamura | H01M 2/105 324/434 |
| 2014/0015488 A1* | 1/2014 | Despesse | H01M 10/425 320/122 |
| 2014/0021925 A1* | 1/2014 | Asakura | B60L 3/0046 320/126 |
| 2014/0084867 A1* | 3/2014 | Hamaoka | H02J 7/025 320/116 |
| 2014/0125289 A1* | 5/2014 | Tonomura | H02J 7/0029 320/134 |
| 2014/0156209 A1* | 6/2014 | Yuan | G01R 31/3606 702/63 |
| 2014/0306662 A1* | 10/2014 | Kim | H02J 7/0016 320/118 |
| 2015/0066262 A1* | 3/2015 | Chang | B60L 3/0038 701/22 |
| 2015/0207348 A1* | 7/2015 | Zhu | H01M 10/617 320/116 |
| 2015/0357838 A1* | 12/2015 | Federle | H02J 7/007 320/136 |
| 2015/0362561 A1* | 12/2015 | Du | G01R 31/3842 702/63 |
| 2015/0372515 A1* | 12/2015 | Bulur | H02J 7/0021 320/112 |
| 2016/0096433 A1* | 4/2016 | Gale | G01R 27/025 701/31.9 |
| 2016/0118819 A1* | 4/2016 | Chatroux | H01M 2/206 320/112 |
| 2016/0167540 A1* | 6/2016 | Tabatowski-Bush | B60L 58/15 320/136 |
| 2016/0226270 A1* | 8/2016 | Kim | H02J 7/0021 |
| 2016/0344068 A1* | 11/2016 | Kim | H01M 10/4257 |
| 2016/0344207 A1* | 11/2016 | Bulur | H02J 7/0021 |
| 2016/0370430 A1* | 12/2016 | Jeon | G01R 31/3606 |
| 2017/0030976 A1* | 2/2017 | Suzuki | G01R 31/3624 |
| 2017/0108536 A1* | 4/2017 | Hebiguchi | G01R 15/08 |
| 2017/0259687 A1* | 9/2017 | Chikkannanavar | B60L 11/1861 |
| 2017/0326986 A1* | 11/2017 | Gale | G01R 27/025 |
| 2017/0343611 A1* | 11/2017 | Nakamura | H01M 2/105 |
| 2018/0038916 A1* | 2/2018 | Haag | B60L 3/0046 |
| 2018/0217207 A1* | 8/2018 | Yuan | G01R 31/3606 |
| 2018/0275202 A1* | 9/2018 | Zhan | H01M 10/42 |
| 2019/0173272 A1* | 6/2019 | Yoon | H02H 3/05 |
| 2019/0195952 A1* | 6/2019 | Riley | G01R 31/382 |

FOREIGN PATENT DOCUMENTS

| | | | |
|---|---|---|---|
| JP | 5167521 B2 * | 3/2013 | |
| JP | 2013-65797 A | 4/2013 | |
| JP | 2013235689 A * | 11/2013 | |
| JP | 2014-11428 A | 1/2014 | |
| KR | 10-2008-0000390 A | 1/2008 | |
| KR | 10-2013-0087097 A | 8/2013 | |
| KR | 10-1416798 B1 | 7/2014 | |
| KR | 10-1479554 B1 | 1/2015 | |
| WO | WO 0245197 A2 * | 6/2002 | H01M 8/04246 |

* cited by examiner

FAULTY CELL DETECTION DEVICE AND FAULTY CELL DETECTION METHOD

CROSS-REFERENCE TO RELATED APPLICATION(S)

This application claims the benefit under 35 U.S.C. § 119(a) of Korean Patent Application No. 10-2016-0003853, filed on Jan. 12, 2016, in the Korean Intellectual Property Office, the entire disclosure of which is incorporated herein by reference for all purposes.

BACKGROUND

1. Field

The following description relates to a faulty cell detection device and a faulty cell detection method to detect a faulty cell of a battery pack using a current sensor.

2. Description of Related Art

Generally, secondary batteries are batteries that can be charged and discharged unlike primary batteries for which charging is impossible. The secondary battery is used as an energy source of compact mobile devices, such as cellular phones, notebook computers, camcorders, wearable devices, or medium and large capacity devices such as electric vehicles, hybrid electric vehicles, electric bicycles, an energy storage system (ESS), an uninterruptible power supply (USP), robots, satellites, etc.

A compact mobile device, among the above-described devices, uses a few battery cells for one device. On the other hand, because the medium and large capacity devices, such as electric vehicles, hybrid electric vehicles, electric bicycles, an ESS, a UPS, robots, or satellites need high output power and high capacity, the medium and large capacity devices use battery packs in which a plurality of battery cells are electrically connected to each other.

Generally, the battery cells included in the battery pack include fuses which block radio waves generated by an explosion occurring in a breakdown to protect the battery cells from damage due to the explosion. When a breakdown of battery cells occurs and a fuse is cut off due to such breakdown during the operation of the battery pack, in the normal cells of the battery pack including a faulty cell that is blocked by the fuse, an overcurrent flows compared to the current before the occurrence of the breakdown of the battery cells. The overcurrent is generated because a current flowing through the faulty cell instead flows through the normal battery cells. Further, as a result of a current of an amount more than initially designed flows through a normal battery of the battery pack including the faulty cell, the cells degrade with a reduced life.

As described above, when one battery cell in the battery pack has a breakdown, there is a problem in that lifetime reduction of other battery cells included in the same battery pack is expedited due to a chain reaction from the breakdown. Therefore, studies are continually being conducted to accurately determine a state of a battery and detect a breakdown of the battery.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In accordance with an embodiment, there may be provided a device to detect a faulty cell in a battery module, including: a current sensor including a first current sensor configured to measure a current of a battery pack including the battery module, and a second current sensor configured to measure a current of a battery cell among battery cells in the battery module; and a faulty cell detector configured to detect occurrence of the faulty cell based on the measured current of the battery pack and the measured current of the battery cell.

The second current sensor may be connected to one of the battery cells to measure a current of the connected battery cell.

The faulty cell detector may detect the occurrence or a number of faulty cells based on a number of the battery cells and a ratio of the measured current of the battery pack to the measured current of the battery cell.

The device may also include: a battery controller configured to control charging and discharging of the battery module or the battery cells based on the number of the detected faulty cells.

In response to the occurrence of the faulty cell, the battery controller may determine a number of normal battery cells and controls a state of charge between the normal battery cells to be equal.

The second current sensor may be connected to a battery cell unit including two or more battery cells among the battery cells and may be configured to measure a current of the battery cell unit.

The faulty cell detector may detect the occurrence of the faulty cell or a number or location of battery cell units including faulty cells based on a ratio of the measured current of the battery pack to the measured current of each of the battery cell units.

The second current sensor may be connected to each of the battery cells to measure a current of each of the battery cells.

The faulty cell detector may detect any one or any combination of any two or more of the occurrence and location of the faulty cell, and a number of faulty cells based on the measured current of each of the battery cells.

The device may also include: a battery guide configured to provide any one or any combination of any two or more of the occurrence and the location of the faulty cell, and the number of the faulty cells.

In accordance with an embodiment, there may be provided a method to detect a faulty cell in a battery module, including: measuring a current of a battery pack including the battery module and a current of a battery cell among battery cells; and detecting faulty cells based on the measured current of the battery pack and the measured current of the battery cell.

The measuring of the current of the battery pack and the current of the battery cell may include measuring a current of the connected battery cell using a current sensor connected to any one of the battery cells; and the detecting of the faulty cells may include detecting the faulty cell or a number of faulty cells based on a number of battery cells and a ratio of the current of the battery pack to the measured current of the battery cell of the battery cells.

The method may also include: controlling a battery by controlling charging and discharging of the battery module or the battery cells based on the number of the detected faulty cells.

The measuring of the currents may include measuring a current of each battery cell units using a current sensor, which may be connected to each of the battery cell units, wherein each of the batter cell units may include two or more battery cells; and the detecting of the faulty cells may include detecting the occurrence of the faulty cells or the number or locations of the battery cell units based on a ratio of the measured current of the battery pack to the measured current of each of the battery cell units.

The measuring of the currents may include measuring a current of each of the battery cells using a current sensor connected to each of the battery cells; and the detecting of the faulty cells may include detecting any one or any combination of any two or more of the occurrence and the location of the faulty cell, and the number of the faulty cells based on the measured current of each of the battery cells.

The method may also include: providing the faulty cells by providing any one or any combination of any two or more of the occurrence and the location of the faulty cell, and the number of the faulty cells.

In accordance with an embodiment, there may be provided a device to detect a faulty cell in a battery module, including: a current sensor including a first current sensor configured to measure a current of a battery pack including the battery module, and a second current sensor configured to measure a current of a resistor connected in parallel with the battery cells; and a faulty cell detector configured to detect the measured current of the battery pack and occurrence of faulty cells based on the measured current of the resistor.

The faulty cell detector may detect the occurrence or a number of the faulty cells based on a number of the battery cells, the measured current of the battery pack, the measured current of the resistor, and a resistance value of the resistor.

The device may also include a battery controller configured to control charging and discharging of the battery cells based on the occurrence or the number of the detected faulty cells upon the faulty cells being detected.

The battery module further may include a diode configured to block the current of the resistor as energy may be charged in the battery pack or the battery cells.

Other features and aspects will be apparent from the following detailed description, the drawings, and the claims.

Figure 1:
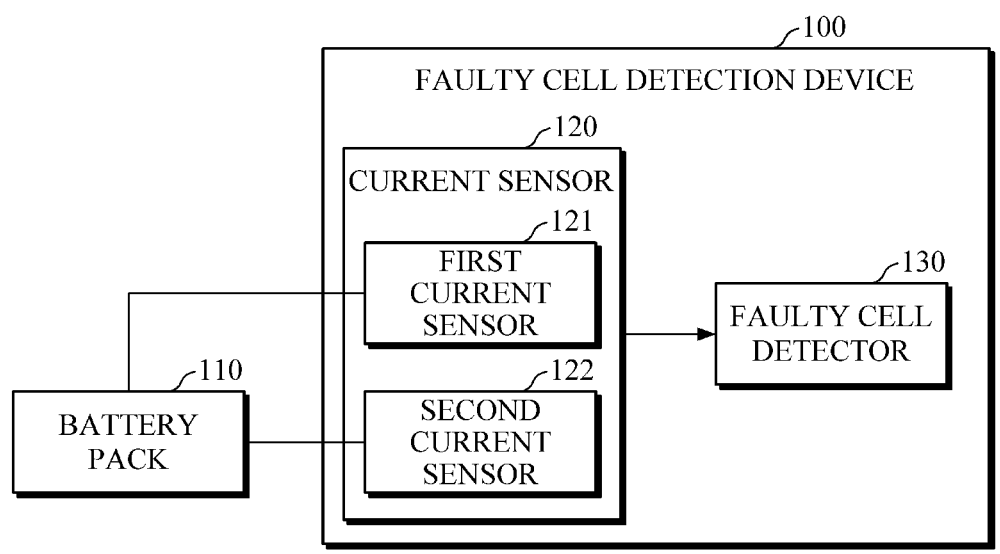
FIG. 1 is a block diagram illustrating a faulty cell detection device and a battery pack, according to an embodiment.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or apparatuses described herein. However, various changes, modifications, and equivalents of the methods, apparatuses, and/or apparatuses described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or apparatuses described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, embodiments of a faulty cell detection device and a faulty cell detection method will be described in detail with reference to the accompanying drawings. Further, although the present disclosure is described based on an assumption that a value of a resistor of a battery cell included in one battery module is constant for ease of description of the faulty cell detection device and the faulty cell detection method. However, a different value of the resistor may be applied in embodiments as described below of the faulty cell detection device and the faulty cell detection method.

Because example values to be described below, such as a current value, a value of a resistor, etc., may each have an error range in consideration of characteristics of a circuit, the example values to be described below may each be applied to the faulty cell detection device and the faulty cell detection method within a range which is the same as or similar to the error range.

FIG. 1 is a block diagram illustrating a faulty cell detection device 100 and a battery pack 110, according to one embodiment.

Referring to FIG. 1, the faulty cell detection device 100 includes a current sensor 120 and a faulty cell detector 130, a battery pack 110 includes a plurality of battery modules, and each of the plurality of battery modules includes a plurality of battery cells.

The battery pack 110 supplies power to a driver in which the faulty cell detection device 100 is mounted. The driver may include, for example, a vehicle, an ESS, a notebook computer, a robot, a satellite, or a wearable device. According to an example, the battery module may be a secondary battery including nickel-cadmium, lithium ion, nickel-hydrogen, lithium polymer, etc. The current sensor 120 includes a first current sensor 121 and a second current sensor 122. The first current sensor 121 is connected to the battery pack 110 to measure a current of the battery pack 110.

Figure 2:
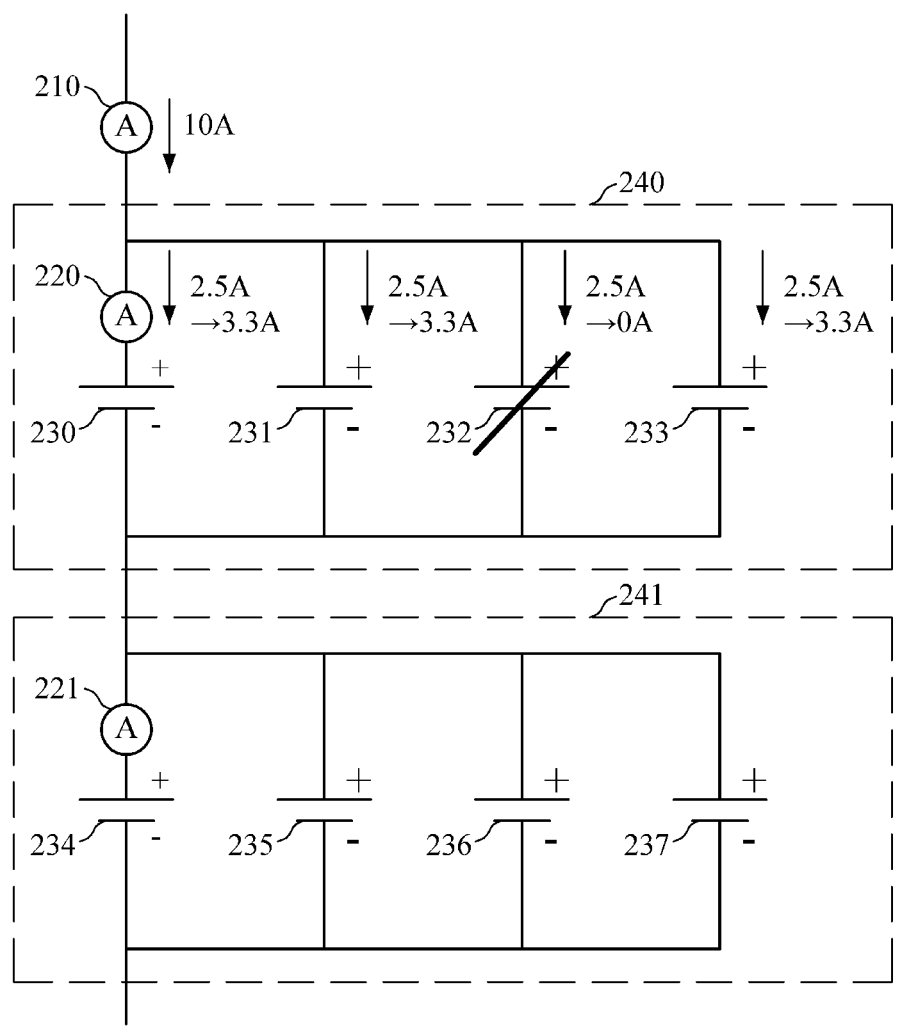
FIG. 2 illustrates connections between current sensors and battery cells, according to an embodiment.
Figure 3:
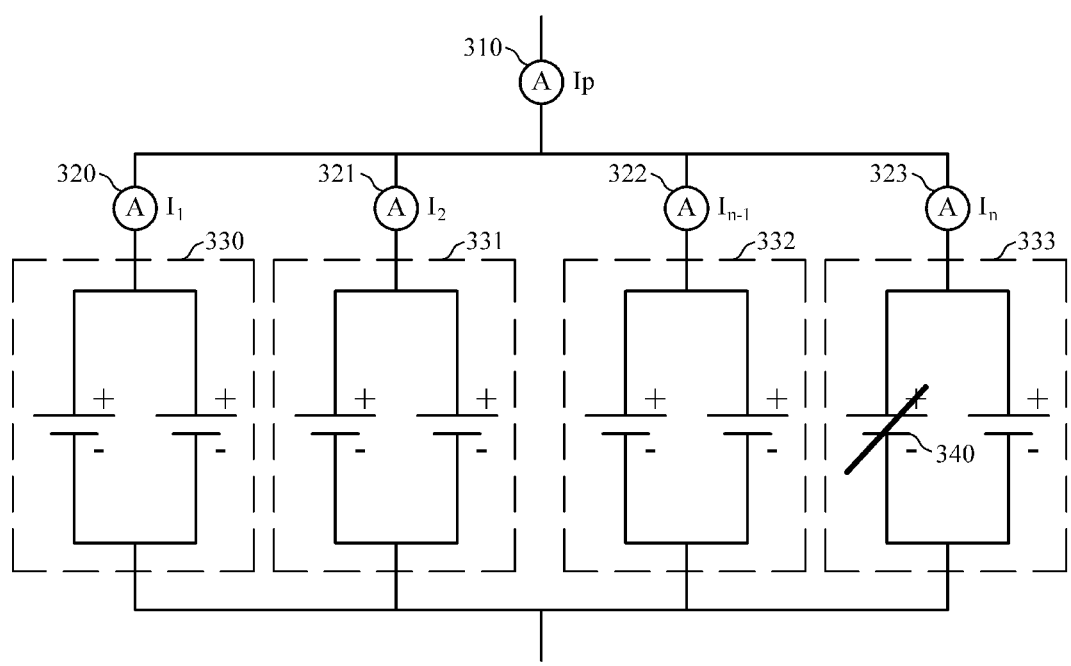
FIG. 3 illustrates connections between current sensors and battery cell units, according to an embodiment.
Figure 4:
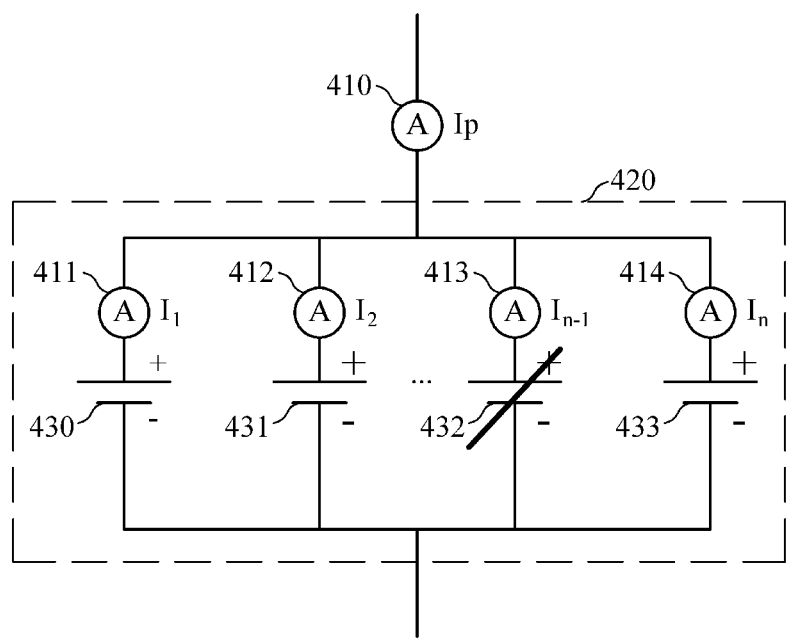
FIG. 4 illustrates connections between current sensors and battery cells, according to another embodiment.

The second current sensor 122 is connected to the battery cells included in the battery module of the battery pack 110 to measure a current of each battery cell. The method of connecting the second current sensor and the battery cells may include various methods as shown in FIGS. 2, 3, and 4, which will be described with reference to FIGS. 2, 3, and 4 below. Although the current sensor 120 includes a single first current sensor 121 and a single second current sensor 122, as shown in FIG. 1, a plurality of first and second current sensors may be included in some embodiments.

The first current sensor 121 and the second current sensor 122 each measure a current using a hall sensor, a method using a resistor and a voltmeter, or another method configured to measure current. When each of the first current sensor 121 and the second current sensor 122 measures a current by the method using a resistor and a voltmeter, a method in which a voltage of a resistor is measured and a current value is then calculated by dividing the measured voltage value by the resistance value of the resistor according to Ohm's law.

The faulty cell detector 130 detects whether faulty cells have occurred in the battery pack and/or the number of the faulty cells. Hereinafter, an example of one battery module will be described for convenience of description.

According to one aspect, the faulty cell detector 130 detects occurrence of faulty cells in the battery module based on a ratio of a current of the battery pack 110 measured by the first current sensor 121 to a current of the battery cell of the battery module measured by the second current sensor 122.

For example, when the battery cells included in the battery module are maintained in a normal state, a ratio of a current of the battery pack 110 measured by the first current sensor 121 to a current of the battery cell measured by the second current sensor 122 is constantly maintained regardless of an increase or decrease in the current of the battery pack 110. Therefore, when the ratio of the current of the battery pack 110 measured by the first current sensor 121 to the current of the battery cell measured by the second current sensor 122 is constantly maintained, the faulty cell detector 130 detects and determines that the battery cells are in a normal state.

In another example, when a faulty cell occurs in the battery cells in time due to continual use of the battery cells and a fuse in the battery cell breaks, the battery cell becomes an open circuit due and a current does not flow through a circuit line connected to the faulty cell. As a result, an overcurrent flows through the other battery cells included in the battery module, which includes the faulty cell. Accordingly, a ratio of a current of the battery pack 110 measured by the first current sensor 121 to a current of the battery cell measured by the second current sensor 122 increases. Therefore, when the ratio of the current of the battery pack 110 measured by the first current sensor 121 to the current of the battery cell measured by the second current sensor 122 increases, the faulty cell detector 130 detects and determines that a faulty cell has occurred in the battery cells.

According to another embodiment, the faulty cell detector 130 may detect occurrence of a faulty cell on the basis of the number of total battery cells included in the battery module and a ratio of a measured current of the battery pack 110 to a measured current of the battery cell. An embodiment related with the above will be described in descriptions of FIG. 2.

FIG. 2 illustrates connections between current sensors and battery cells, according to another embodiment.

Referring to FIG. 2, the battery pack 110 includes one or more battery modules 240 and 241, and each of the battery modules 240 and 241 includes one or more battery cells 230, 231, 232, 233, 234, 235, 236, and 237. Further, according to the embodiment, a first current sensor 210 is connected to the battery pack 110 to measure a current of the battery pack 110, and second current sensors 220 and 221 are respectively connected to the battery cells 230 and 234 of the battery modules 240 and 241 to measure a current for each of the connected battery cells 230 and 234.

The case in which each of the battery modules 240 and 241 includes only four battery cells, in other words, the battery module 240 includes the battery cells 230, 231, 232, and 233 and the battery module 241 includes 234, 235, 236, and 237 in FIG. 2, is just for convenience of the drawing, and each battery module 240 and 241 may include at least one or more battery cells.

The plurality of battery modules 240 and 241 included in the battery pack 110 are connected in series as show in FIG. 2. Although two battery modules 240 and 241 are connected to each other in FIG. 2, the present disclosure is not limited thereto, and at least one or more battery modules 240 and 241 may be connected to each other. Hereinafter, for purposes of brevity, the first battery module 240 of FIG. 2 will be described.

One embodiment of a faulty cell detection device as shown in FIG. 2 will be described. When the battery cells 230, 231, 232, and 233 included in the battery module 240 are maintained in a normal state, a ratio of a current of the battery pack 110 measured by the first current sensor 210 to a current of the battery cell 230 measured by the second current sensor 220 is constantly maintained as "2.5 [A]/10 [A]=1/4=0.25." This ratio may be constantly maintained even when the current of the battery pack 110 is increased to 30 [A], that is, a ratio of a current measured by the first current sensor 210 to a current of the battery cell 230 measured by the second current sensor 220 is "7.5 [A]/30 [A]=1/4=0.25."

In another example, when a faulty cell 232 occurs in the battery module 240, the faulty cell detector 130 detects whether the faulty cell 232 has occurred and/or the number of faulty cells when the faulty cell 232 occurs based on the number of the plurality of battery cells 230, 231, 232, and 233 and the ratio of the measured current of the battery pack 110 to the measured current of the battery cell 230. Specifically, when a faulty cell 232 among four battery cells 230, 231, 232, and 233 occurs, a current flowing through the faulty cell 232 is distributed between three battery cells 230, 231, and 233 and, as a result, a current flowing through the second current sensor 220 is increased. Specifically, because a current of 10 [A] of the battery pack 110 flows through three battery cells 230, 231, and 233, a current measured by the second current sensor 220 is increased by about 3.3 [A]. Accordingly, a ratio of a current measured by the first current sensor 210 to a current measured by the second current sensor 220 becomes "3.3 [A]/10 [A]=0.33" and increases compared to the ratio when all of the battery cells 230, 231, 232, and 233 are operating in a normal state. In another example, when two battery cells 232 and 233 are broken down, a current of 5 [A] flows through each of the battery cells 230 and 231 of the battery module 240 including the faulty cells 232 and 233. As a result, a ratio of a current measured by the first current sensor 210 to a current measured by the second current sensor 220 increases to "5 [A]/10 [A]=0.5", and the faulty cell detector 130 detects occurrence of the faulty cells 232 and 233.

Further, by using Equation 2, the faulty cell detector 130 detects the number of faulty cells included in the battery module 240 based on the number of the plurality of battery cells 230, 231, 232, and 233 and the ratio of the measured current of the battery pack 110 to the measured current of the battery cell 230. Equation 2 is Equation 1 in terms of the current of the battery pack 110 measured by the first current sensor 210 and is summarized as an equation in terms of the number of faulty cells m, as follows.

$$Ip=Ic*(m-n) \qquad \text{[Equation 1]}$$

$$m=n-(Ip/Ic) \qquad \text{[Equation 2]}$$

For Equations 1 and 2, m denotes the number of faulty cells included in one battery module 240, n denotes the number of total battery cells 230, 231, 232, and 233 included in one battery module 240, Ip denotes a current of the battery pack 110 measured by the first current sensor 210, and Ic denotes a current of the battery cell 230 connected to the second current sensor 220. Because n is a set or predefined value and Ip and Ic are values measured by the current sensor, the number of faulty cells m are calculated by Equation 2. Further, the faulty cell detector detects and determines that the battery cells 230, 231, 232, and 233 are in a normal state when m is zero and detects and determines that the faulty cell 232 occurs when m is not zero. In FIG. 3, the faulty cell detector 130 determines that the number of the faulty cells m is one as calculated by "m=4-(10/3.3)=4-3=1."

In an embodiment, such detection of the faulty cell 232 only occurs in the battery module 240. In another embodiment, such detection of the faulty cell 232 occurs in the battery module 240 and in the battery module 241 connected to the battery module 240 in series as shown in FIG. 2. In further embodiments, such detection of the faulty cell 232 from three or more battery modules connected in series as described above.

As described above, in the case of the faulty cell detection device 100 configured as in FIG. 2, a determination of whether the faulty cell 232 occurs and/or the number of faulty cells when the faulty cells occur can be effectively made by using a simple configuration in which the second current sensor 220 is only connected to one battery cell 230 in one module 240.

FIG. 3 illustrates connections between current sensors and battery cell units, according to one embodiment.

One aspect of a faulty cell detection device as shown in FIG. 3 will be described. Second current sensors 320, 321, 322, and 323 are respectively connected to battery cell units 330, 331, 332, and 333. Each of the battery cell units 330, 331, 332, and 333 includes two or more battery cells among a plurality of battery cells. The second current sensors 320, 321, 322, and 323 measure currents of the corresponding battery cell units 330, 331, 332, and 333. Hereinafter, although the present disclosure is described based on an assumption that two battery cells are included in each of the battery cell units 330, 331, 332, and 333 in FIG. 3, the present disclosure is not limited thereto, and a single, three, or more battery cells may be included in each of the battery cell units 330, 331, 332, and 333. Further, the number of the battery cells included in each of the battery cell units 321, 322, 331, and 332 may be the same number as or different from each other. For example, when two battery cells are included in each of the battery cell units 330, 331, 332, and 333, each of the second current sensors 320, 321, 322, and 323 measures a value that is the sum of current values of two battery cells.

In one example in which a faulty cell occurs in the battery cell unit 333, the faulty cell detector 130 detects whether a faulty cell 340 occurs, the number of faulty cells included in the battery cell unit 333, a location of the corresponding battery cell unit 333 based on a ratio of the current of the battery pack 110 measured by a first current sensor 310 to the current of each of the battery cell units 330, 331, 332, and 333 measured by each of the second current sensors 320, 321, 322, and 323. For example, when the ratio of the current measured by the first current sensor 310 to the current measured by each of the second current sensors 320, 321, 322, and 323 is constantly maintained, the faulty cell detector 130 detects and determines that the battery cells are in a normal state, but when the ratio is increased, the faulty cell detector 130 detects that the faulty cell 340 has occurred.

Further, when the ratio of the current measured by the first current sensor 310 to the current measured by each of the second current sensors 320, 321, 322, and 323 is increased, the faulty cell detector 130 detects and determines that the faulty cell 340 has occurred in the battery cell unit 333 connected to the second current sensor 323 related to the increased ratio and detects and determines the location of the battery cell unit 333 including the faulty cell 340.

FIG. 4 illustrates connections between current sensors and battery cells, according to another embodiment.

One aspect of a faulty cell detection device as shown in FIG. 4 will be described. Second current sensors 411, 412, 413, and 414 are connected to correspond to a plurality of battery cells 430, 431, 432, and 433. The second current sensors 411, 412, 413, and 414 measure currents of the corresponding battery cells 430, 431, 432, and 433. For example, the second current sensors 411, 412, 413, and 414 are respectively connected the battery cells 430, 431, 432, and 433 and each is a semiconductor device or an element such as a micro circuit.

For example, when a breakdown occurs in one battery cell 432 of the plurality of battery cells 430, 431, 432, and 433, a ratio of a current of a first current sensor 410 to a current of the second current sensor 413 corresponding to the faulty cell 432 is outside of a preset ratio range, the faulty cell detector 130 identifies and detects that the battery cell 432 connected to the corresponding second current sensor 413 is the faulty cell and detects and determines the location of the faulty cell 432 based on or using a location of the corresponding second current sensor 413. Outside of the preset ratio range may be the current of the second current sensor 413 corresponding to the faulty cell 432 being greater than the preset ratio range or lower than the preset ratio range. Further, the faulty cell detector 130 detects and determines the number of faulty cells based on the number of second current sensors related to the ratio of the current of the first current sensor 410 to the current of the second current sensor 413, which is outside of the preset ratio range.

Figure 5:
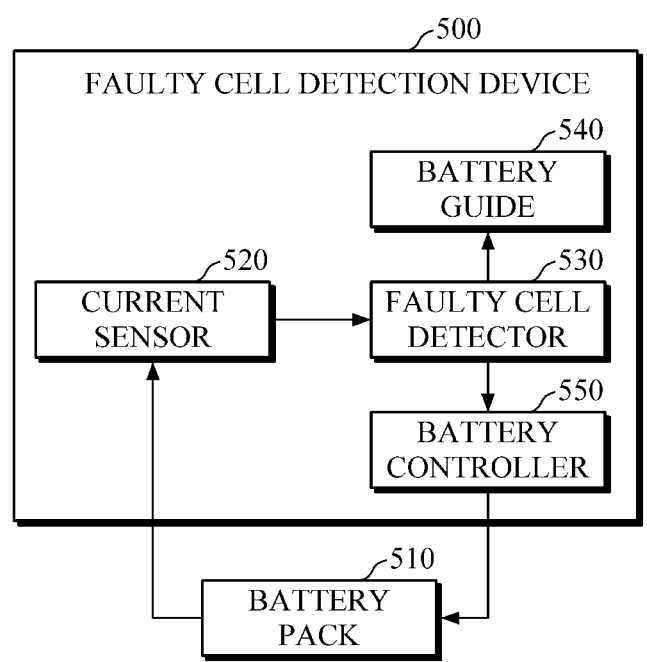
FIG. 5 is a block diagram illustrating a faulty cell detection device and a battery pack, according to another embodiment.

FIG. 5 is a block diagram illustrating a faulty cell detection device and a battery pack, according to another embodiment.

Referring to FIG. 5, a faulty cell detection device 500 includes a current sensor 520, a faulty cell detector 530, a battery guide 540, and a battery controller 550.

Because a battery pack 510, the current sensor 520, and the faulty cell detector 530 have been described in detail with reference to FIG. 1, detailed descriptions thereof previously presented are incorporated herein and are omitted below.

The battery guide 540 detects, determines, provides, or outputs at least one of whether occurrence of faulty cells is detected, the number of the faulty cells, and locations of the faulty cells. Further, the battery guide 540 estimates a state of health (SoH), a state of charge (SoC), a state of function (SoF), and the like of the battery pack 510. In an example, the SoH refers to a degree degradation of performance of the battery pack 510 compared to when the battery pack 510 was manufactured, the SoC refers to information regarding an amount of charge included in the battery pack 510, and the SoF refers to information regarding how much the performance of the battery pack 510 matches preset conditions. Further, the battery guide 540 provides or outputs the estimated SoH, SoC, and SoF.

For example, in a case in which the second current sensors 220 and 221 are connected to corresponding battery cells 230 and 234 included in the battery modules 240 and 241 as shown in FIG. 2, the battery guide 540 detects, determines, and indicates whether faulty cells occur and/or the number of the faulty cells. In another example, in a case in which the second current sensors 320, 321, 322, and 323 are connected to the corresponding battery cell units 330, 331, 332, and 333 as shown in FIG. 3, the battery guide 540 detects, determines, and indicates whether faulty cells occur, locations of battery cell units including the faulty cells, and/or the number of the battery cell units including the faulty cells. Further, in an embodiment in which the second current sensors 411, 412, 413, and 414 are connected to the corresponding battery cells 430, 431, 432, and 433 as shown in FIG. 4, the battery guide 540 detects, determines, and indicates whether a faulty cell 432 related to each of the battery cells 430, 431, 432, and 433 occurs, the number of faulty cells, and/or information of a location of the faulty cell 432 and may also provide an SoC and an SoF, of each of the battery cells 430, 431, 432, and 433.

When faulty cells are detected, the battery controller 550 controls charging and discharging of the battery modules and/or the battery cells included in the battery pack 510 based on the number of the detected faulty cells. For example, when faulty cells occur or exist, the battery controller 550 prevents overcharging and/or overdischarging of the battery cells by considering the number of normal battery cells and controls SoCs between the normal battery cells to be equal. Specifically, when the number of the faulty cells is greater than the number of the normal battery cells, the battery controller 550 reduces energy being charged into the normal battery cells to prevent overcharging. Accordingly, effects of increasing energy efficiency of the battery pack 510 and extending lifetime of the battery pack 510 can be obtained.

Figure 6:
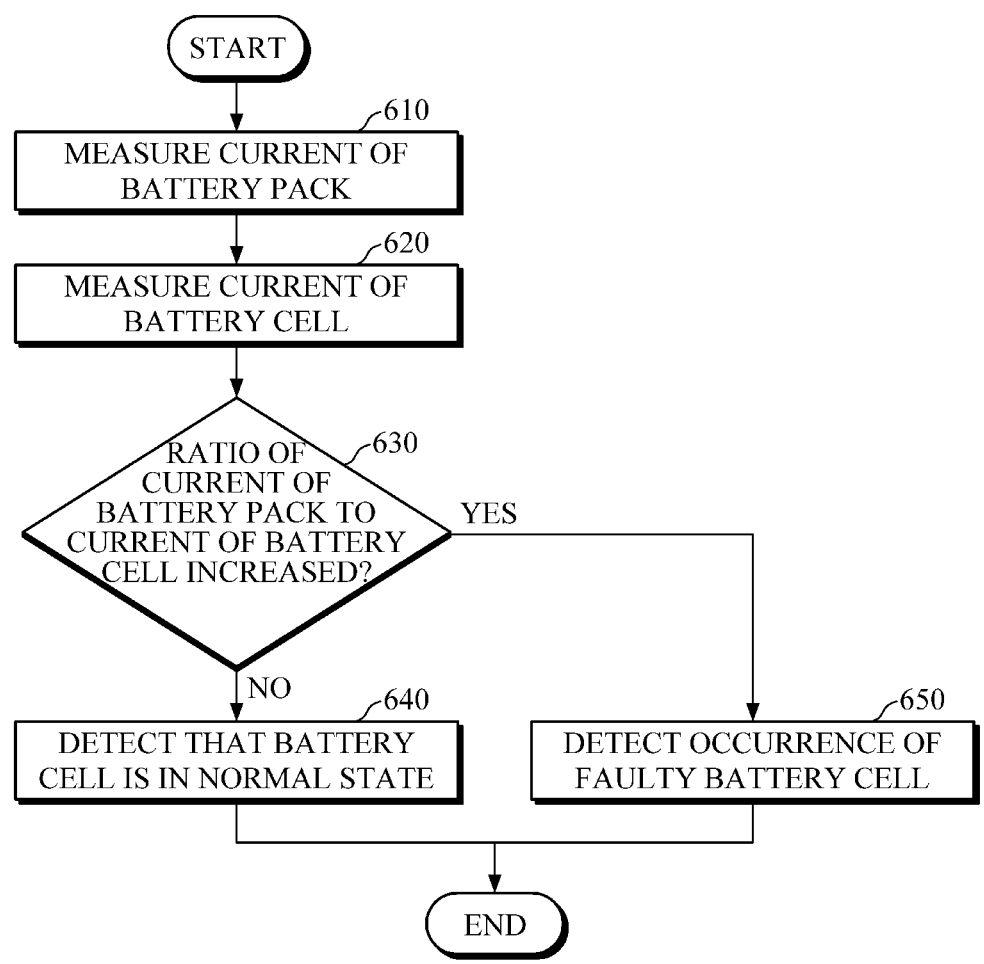
FIG. 6 is a flowchart illustrating a faulty cell detection method, according to an embodiment.

FIG. 6 is a flowchart illustrating a faulty cell detection method, according to one embodiment.

The flowchart of the faulty cell detection method shown in FIG. 6 is an embodiment performed by the faulty cell detection device 100 shown in FIG. 1. At operation S620, the faulty cell detection device 100 measures a current of the battery pack 110 including battery modules and measures a current of at least one battery cell among the plurality of battery cells.

At operation S630, the faulty cell detection device 100 detects occurrence of at least one faulty cell based on a ratio of the measured current of the battery pack 110 to the measured current of the battery cell. For example, when the ratio of the measured current of the battery pack 110 to the measured current of the battery cell is constantly maintained, the faulty cell detection device 100 detects that the battery cells are in a normal state. When the corresponding ratio is increased, at operation S650, the faulty cell detection device 100 detects that a breakdown of at least one of the battery cells has occurred.

According to another embodiment with reference to FIG. 3, the faulty cell detection device 100 is connected to each of the battery cell units 330, 331, 332, and 333, each unit including, for example, two or more battery cells. The faulty cell detection device 100 measures a current of each of the battery cell units 330, 331, 332, and 333, and detects and determines whether at least one faulty cell exists or occurred, the number of battery cell units including the faulty cells, and/or locations of the battery cell units including the at least one faulty cell based on the ratio of the current of the battery pack 110 measured by the first current sensor 310 to the current of each of the battery cell units 330, 331, 332, and 333 measured by the second current sensors 320, 321, 322, and 323, respectively.

Figure 7:
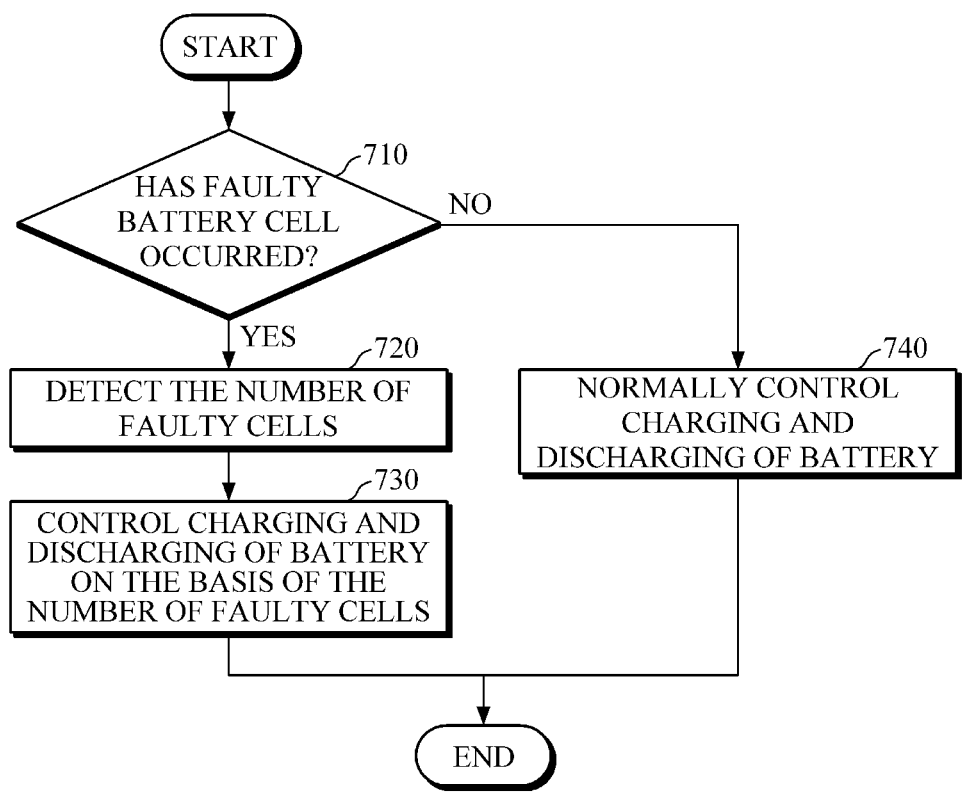
FIG. 7 is a flowchart illustrating a faulty cell detection method, according to another embodiment.

FIG. 7 is a flowchart illustrating a faulty cell detection method, according to another embodiment.

The flowchart of the faulty cell detection method shown in FIG. 7 is an embodiment performed by the faulty cell detection device 500 shown in FIG. 5. At operation S710, the faulty cell detection device 500 is connected to a battery cell, measures a current of the connected battery cell, and detects and determines an occurrence of at least one faulty cell based on the number of the battery cells and a ratio of a current of a battery pack to the measured current of one battery cell of the battery cells.

When the occurrence of faulty cells is detected, at operation S720, the faulty cell detection device 500 detects the number of the faulty cells based on of the number of the battery cells and the ratio of the current of the battery pack to the measured current of one battery cell of the battery cells. At operation S730, the faulty cell detection device 500 charges and discharges battery modules or battery cells based on the number of the detected and corresponding faulty cells. When the faulty cells do not occur, at operation S740, the faulty cell detection device 500 normally controls the charging and discharging of the battery module or battery cell.

In another example, when fault battery cells of the battery modules are not detected, the faulty cell detection device 500 controls the charging and discharging of the battery modules or the battery cells according to conditions set at manufacturing (S740).

Figure 8:
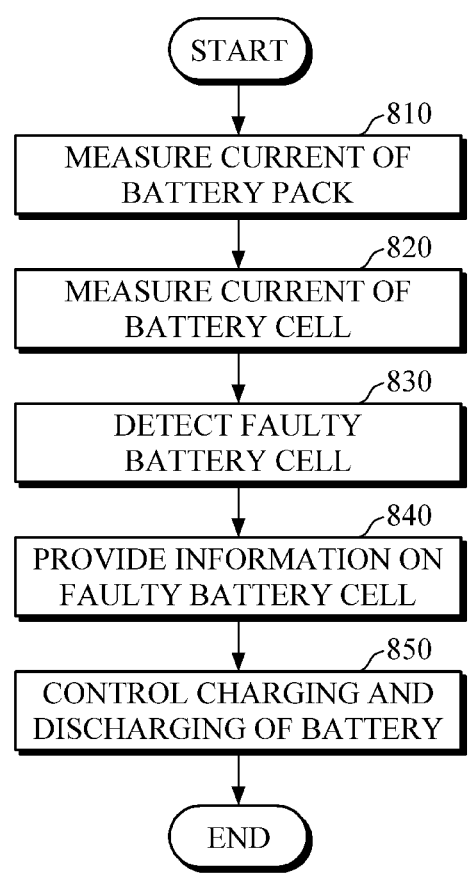
FIG. 8 is a flowchart illustrating a faulty cell detection method, according to another embodiment.

FIG. 8 is a diagram illustrating an example of a faulty cell detection method, according to another embodiment.

The flowchart of a faulty cell detection method shown in FIG. 8 is an embodiment performed by the faulty cell detection device 500 shown in FIG. 5. According to one embodiment, at operation S810, the faulty cell detection device 500 measures a current of a battery pack. At operation S820, the faulty cell detection device 500 is connected to each of a plurality of battery cells to measure a current of each battery cell. At operation S830, the faulty cell detection device 500 detects at least one of an occurrence, the number, and locations of at least one faulty cell based on the measured current of each battery cell.

At operation S840, the faulty cell detection device 500 outputs at least one of the occurrence, the number, and the locations of the at least one detected faulty cell.

At operation S850, the faulty cell detection device 500 controls charging and discharging of battery modules or battery cells based on any one of the occurrence, the number, and the locations of the at least one detected faulty cell.

Figure 9:
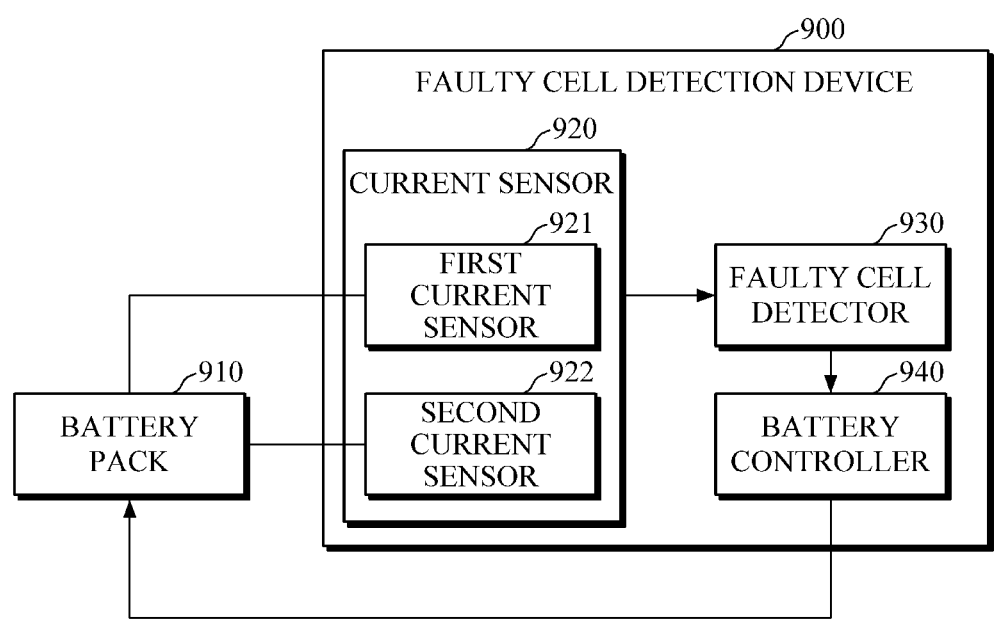
FIG. 9 is a block diagram illustrating a faulty cell detection device and a battery pack, according to another embodiment.

FIG. 9 is a block diagram illustrating a faulty cell detection device and a battery pack, according to another embodiment.

Referring to FIG. 9, the faulty cell detection device 900 includes a current sensor 920, a faulty cell detector 930, and a battery controller 940, and a battery pack 910 may include battery modules, battery cells, and a resistor.

Since the current sensor 920, the faulty cell detector 930, and the battery pack 910 have been described in detail with reference to FIG. 1 and the battery controller 940 has been described with reference to FIG. 5, detailed descriptions thereof are omitted below.

The current sensor 920 includes a first current sensor 921 and a second current sensor 922. The first current sensor 921 measures a current of the battery pack 910.

Figure 10:
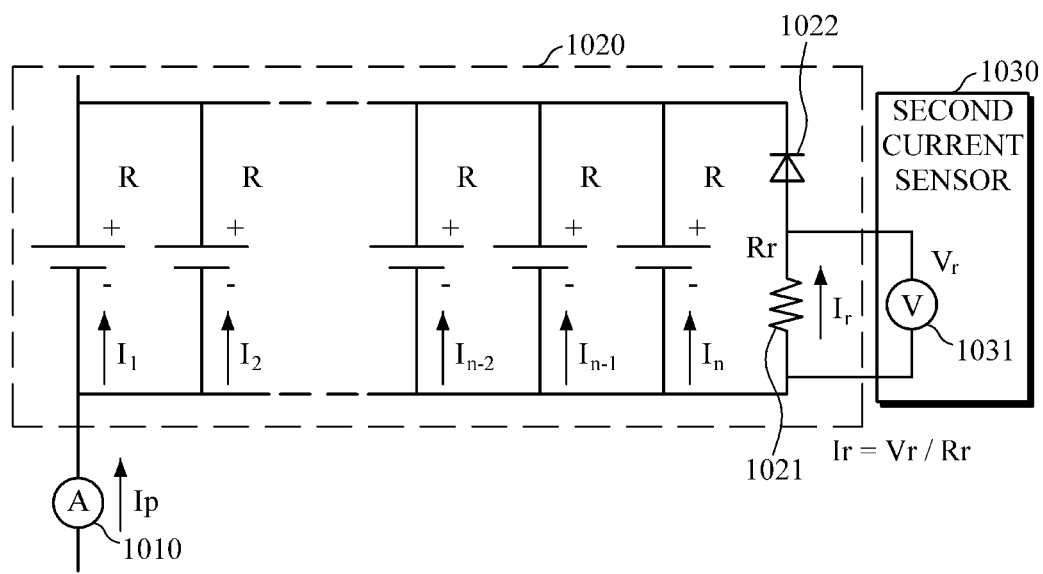
FIG. 10 illustrates connections between a battery module, battery cells, and a faulty cell detection device, according to another embodiment.

The second current sensor 922 measures a current of the resistor connected in parallel with the battery cells. Referring to FIG. 10, a voltage of a resistor 1021 is measured by a voltmeter 1031, and a method to measure the current of the resistor may be used in which a current value of the resistor 1021 is a result value calculated by dividing the voltage value measured by the voltmeter 1031 by a resistance value according to Ohm's law.

According to Equation 4, the faulty cell detector 930 detects an occurrence or the number of faulty cells based on the number of the plurality of battery cells, the measured current of the battery pack 910, the measured current of each battery cell, and the resistance value of the resistor.

When the faulty cells are detected, the battery controller 940 controls charging and discharging of the battery module and/or the battery cells based on the occurrence or the number of the detected faulty cells.

FIG. 10 illustrates connections between a battery module, battery cells, and a faulty cell detection device, according to another embodiment.

According to Equation 4, the faulty cell detector 930 detects and determines occurrence or the number of faulty cells based on the number of the plurality of battery cells, a measured current of the battery pack 910, and measured current and resistance values of the resistor 1021. Equation 4 is based on Equation 3 in terms of the current of the resistor 1021 measured by the second current sensor 922 and is expressed in terms of the number of faulty cells m.

$$Ir = R*Ip/\{R + (n-m)*Rr\} \qquad \text{[Equation 3]}$$

$$m = n - R*\left\{\frac{Ip}{Ir} - 1\right\}/Rr \qquad \text{[Equation 4]}$$

In Equation 3 and Equation 4, m denotes the number of faulty cells included one battery module 1020, n denotes the number of total battery cells included in one battery module 1020, Ip denotes a current of the battery pack 910 measured by the first current sensor 1010, Ir denotes a current of the resistor 1021 connected to the second current sensor 1030, R denotes a resistance value of the battery cell, and Rr denotes a resistance value of the resistor 1021 included in the battery module 1020. Because n, R, Rr are preset values and Ip and Ir values measured by the current sensor, the number of the faulty cells m may be calculated using Equation 4. Further, when m is zero, the battery cell is in a normal state, and when m is not zero, the occurrence of the faulty cells are detected.

Referring to FIGS. 9 and 10, when energy is charged in the battery pack 910 or the battery cells, the battery module 1020 may further include a diode 1022, which blocks a current in the resistor 1021. FIG. 10 is a circuit illustrating a configuration in which the battery module 1020 is discharged. When the battery module 1020 is charged, a direction of a current flow is opposite to that shown in FIG. 10 and, thus, the diode 1022 is an open circuit so that the current of the resistor 1021 does not flow. According to adding the diode 1022, when the battery module 1020 is charged, a current does not flow into the resistor 1021 so as to suppress unnecessary energy consumption in the resistor 1021 and, as a result, a charging time of the battery module 1020 is reduced and energy consumption is effectively suppressed.

Figure 11:
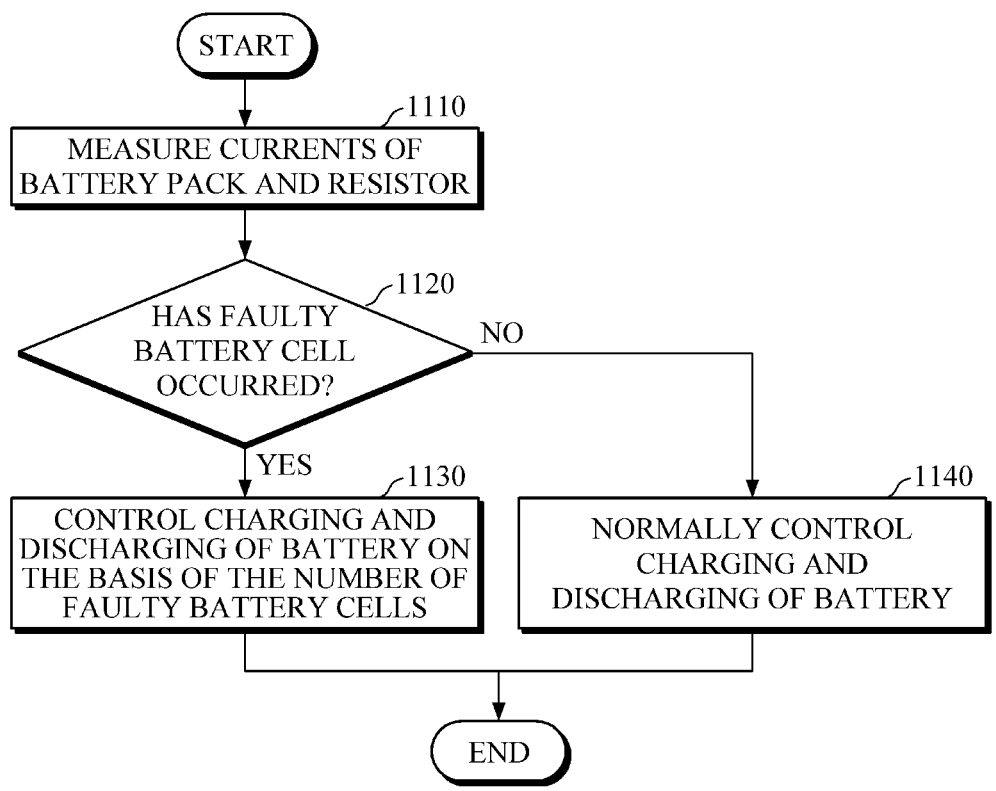
FIG. 11 is a flowchart illustrating a faulty cell detection method, according to another embodiment.

FIG. 11 is a flowchart illustrating a faulty cell detection method, according to another embodiment.

The flowchart of a faulty cell detection method shown in FIG. 11 is an embodiment performed by the faulty cell detection device 900 shown in FIG. 9. At operation S1110, the faulty cell detection device 900 measures a current of a battery pack including battery modules and measures a current of a resistor connected in parallel with battery cells inside the battery modules.

At operation S1120, the faulty cell detection device 900 detects whether faulty cells occur and/or the number of the faulty cells based on the measured current of battery pack 910 and the measured current of the resistor.

At operation S1130, when the occurrence of the faulty cells is detected, the faulty cell detection device 900 controls charging and discharging of the battery modules and/or battery cells on the basis of whether the occurrence of the faulty cells is detected and/or the number of faulty cells. When the faulty cells do not occur, at operation S1140, the faulty cell detection device 900 may normally control the charging and discharging of the battery modules and/or the battery cells. Although the term faulty cells is used throughout the present disclosure, at least one faulty cell may be used in the embodiments described.

The operations in FIGS. 1-8 and 11 may be performed in the sequence and manner as shown, although the order of some operations may be changed or some of the operations omitted without departing from the spirit and scope of the illustrative examples described. Many of the operations shown in FIGS. 1-8 and 11 may be performed in parallel or concurrently.

In an example, the faulty cell detection device 100, the current sensor 120, the first current sensor 121, the second current sensor 122, the faulty cell detector 130, the battery pack 110, the faulty cell detection device 500, the current sensor 520, the battery guide 540, the faulty cell detector 530, the battery controller 550, the battery pack 510, the faulty detection device 900, the current sensor 920, the first current sensor 921, the second current sensor 922, the faulty cell detector 930, the battery controller 940, and the battery pack 910 may be embedded in or interoperate with various digital devices such as, for example, a mobile phone, a cellular phone, a smart phone, a wearable smart device (such as, for example, a ring, a watch, a pair of glasses, glasses-type device, a bracelet, an ankle bracket, a belt, a necklace, an earring, a headband, a helmet, a device embedded in the cloths), a personal computer (PC), a laptop, a notebook, a subnotebook, a netbook, or an ultra-mobile PC (UMPC), a tablet personal computer (tablet), a phablet, a mobile internet device (MID), a personal digital assistant (PDA), an enterprise digital assistant (EDA), a digital camera, a digital video camera, a portable game console, an MP3 player, a portable/personal multimedia player (PMP), a handheld e-book, an ultra mobile personal computer (UMPC), a portable lab-top PC, a global positioning system (GPS) navigation, a personal navigation device or portable navigation device (PND), a handheld game console, an e-book, and devices such as a high definition television (HDTV), an optical disc player, a DVD player, a Blue-ray player, a setup box, robot cleaners, a home appliance, content players, communication systems, image processing systems, graphics processing systems, other consumer electronics/information technology(CE/IT) device, or any other device capable of wireless communication or network communication consistent with that disclosed herein. The digital devices may be may be embedded in or interoperate with a smart appliance, an intelligent vehicle, an electric vehicle, a hybrid vehicle, a smart home environment, or a smart building environment.

The faulty cell detection device 100, the current sensor 120, the first current sensor 121, the second current sensor 122, the faulty cell detector 130, the battery pack 110, the faulty cell detection device 500, the current sensor 520, the battery guide 540, the faulty cell detector 530, the battery controller 550, the battery pack 510, the faulty detection device 900, the current sensor 920, the first current sensor 921, the second current sensor 922, the faulty cell detector 930, the battery controller 940, and the battery pack 910 described in FIGS. 1, 5, and 9 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 5-8 and 11 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A device to detect one or more faulty cells in a battery module, the device comprising:
    a current sensor comprising
        a first current sensor configured to measure an input current of a battery pack comprising the battery module, and
        a second current sensor configured to measure a current of a battery cell among battery cells in the battery module;
    a faulty cell detector configured to detect an occurrence of the one or more faulty cells using a ratio of the measured current of the first current sensor to the measured current of the second current sensor corresponding to the one or more faulty cells; and
    a battery controller configured to control charging and discharging of the battery module using a number of the detected one or more faulty cells,
    wherein the one or more faulty cells is detected when the ratio of the measured current of the first sensor to the measured current of the second sensor is outside of a predetermined ratio range.

2. The device of claim 1, wherein in response to the occurrence of the one or more faulty cells, the battery controller is configured to determine a number of normal battery cells and controls a state of charge between the normal battery cells to be equal.

3. The device of claim 1, wherein the second current sensor is connected to one of the battery cells to measure a current of the connected battery cell.

4. The device of claim 3, wherein the faulty cell detector detects (i) the occurrence of one or more faulty cells or (ii) a number of the one or more faulty cells based on both a number of the battery cells and a ratio of the measured current of the battery pack to the measured current of the battery cell.

5. The device of claim 1, wherein the second current sensor is connected to a battery cell unit of the battery module, wherein the battery cell unit comprises the battery cell and one or more additional battery cells among the battery cells, and is configured to measure a current of the battery cell unit.

6. The device of claim 5, wherein the faulty cell detector detects the occurrence of the one or more faulty cells, or detects a number of the one or more faulty cells, or detects a location of battery cell units comprising the one or more faulty cells based on a ratio of the measured current of the battery pack to the measured current of the battery cell unit.

7. The device of claim 1, wherein the second current sensor is connected to each of the battery cells to measure a current of each of the battery cells.

8. The device of claim 7, wherein (a) the faulty cell detector detects either one or both of (i) the occurrence of the one or more faulty cells and (ii) respective locations of the one or more faulty cells based on the measured current of each of the battery cells, or (b) the faulty cell detector detects a number of the one or more faulty cells based on the measured current of each of the battery cells.

9. The device of claim 8, further comprising:
    a battery guide configured to identify any one or any combination of any two or more of the occurrence of the one or more faulty cells, the respective locations of the one or more faulty cells, or a number of the one or more faulty cells, based on a location of the second current sensor.

10. A method to detect a faulty cell in a battery module comprising battery cells, the method comprising:

measuring, with a first sensor, an input current of a battery pack comprising the battery module;

measuring, with a second sensor, a current of a battery cell among the battery cells of the module;

detecting one or more faulty cells using a ratio of the measured current of the first sensor and the measured current of the second current sensor corresponding to the one or more faulty cells; and controlling charging and discharging of the battery module using a number of the detected one or more faulty cells, wherein the one or more faulty cells is detected when the ratio of the measured current of the first sensor and the measured current of the second sensor is outside of a predetermined ratio range.

11. The method of claim 10, wherein:

the measuring of the current of the battery pack and the measuring of the current of the battery cell comprises measuring a current of the battery cell using a current sensor connected to any one of the battery cells; and the detecting of the one or more faulty cells comprises detecting at least one of an occurrence of the one or more faulty cells and the number of the one or more faulty cells based on a number of battery cells and a ratio of the current of the battery pack to the current of the battery cell.

12. The method of claim 10, wherein:

the measuring of the current of the battery cell comprises measuring a current of a battery cell unit of the battery module using a current sensor connected to the battery cell unit, wherein the battery cell unit comprises the battery cell and one or more additional battery cells from among the battery cells; and the detecting of the one or more faulty cells comprises detecting a location of the battery cell unit based on a ratio of the measured current of the battery pack to the measured current of the battery cell unit.

13. The method of claim 10, wherein:

the measuring of the current of the battery cell comprises measuring a current of each of the battery cells of the battery module using a current sensor connected to each of the battery cells; and the detecting of the one or more faulty cells comprises (a) detecting either one or both of (i) an occurrence of the one or more faulty cells and (ii) respective locations of the one or more faulty cells based on the measured current of each of the battery cells, or (b) detecting a number of the one or more faulty cells based on the measured current of each of the battery cells.

14. The method of claim 13, further comprising:

identifying (a) either one or both of (i) the occurrence of the one or more faulty cells and (ii) the respective locations of the one or more faulty cells based on a location of the current sensor, or (b) the number of the one or more faulty cells based on a location of the current sensor.

15. A device to detect a faulty cell in a battery module comprising battery cells, the device comprising:

a current sensor comprising
   a first current sensor configured to measure an input current of a battery pack comprising the battery module, and
   a second current sensor configured to measure a current of a resistor connected in parallel with the battery cells; and a faulty cell detector configured to detect occurrence of one or more faulty cells based on the measured current of the battery pack and the measured current of the resistor, wherein the one or more faulty cells is detected when a ratio of the measured current of the first sensor to the measured current of the second sensor is outside of a predetermined ratio range.

16. The device of claim 15, wherein the faulty cell detector detects at least one of (i) the occurrence of the one or more faulty cells and (ii) a number of the one or more faulty cells based on a number of the battery cells, the measured current of the battery pack, the measured current of the resistor, and a resistance value of the resistor.

17. The device of claim 16, further comprising a battery controller configured to control charging and discharging of the battery cells based on (i) the occurrence of the detected one or more faulty cells, or (ii) the number of the detected one or more faulty cells.

18. The device of claim 17, wherein the battery module further comprises a diode configured to block the current of the resistor as the battery pack is charged.

* * * * *